(12) United States Patent
Shi et al.

(10) Patent No.: US 9,444,061 B2
(45) Date of Patent: Sep. 13, 2016

(54) DISPLAY SUBSTRATE, MANUFACTURING METHOD THEREOF AND FLEXIBLE DISPLAY DEVICE

(71) Applicant: BOE TECHNOLOGY GROUP CO., LTD., Beijing (CN)

(72) Inventors: Ling Shi, Beijing (CN); Yunfei Li, Beijing (CN); Kazuyoshi Nagayama, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/403,709

(22) PCT Filed: May 21, 2014

(86) PCT No.: PCT/CN2014/078013
§ 371 (c)(1),
(2) Date: Nov. 25, 2014

(87) PCT Pub. No.: WO2015/051639
PCT Pub. Date: Apr. 16, 2015

(65) Prior Publication Data
US 2015/0303388 A1    Oct. 22, 2015

(30) Foreign Application Priority Data

Oct. 12, 2013 (CN) .......................... 2013 1 0475753

(51) Int. Cl.
*H01L 27/00* (2006.01)
*H01L 29/00* (2006.01)
(Continued)

(52) U.S. Cl.
CPC ....... *H01L 51/0097* (2013.01); *H01L 27/1218* (2013.01); *H01L 29/78603* (2013.01);
(Continued)

(58) Field of Classification Search
CPC .......... H01L 51/0097; H01L 51/0001; H01L 51/5237; H01L 51/5253; H01L 27/3244; H01L 27/1214; H01L 27/12; H01L 2251/10; H01L 2251/5338; H01L 2251/558; Y02E 10/549; Y02E 10/54; Y02E 10/548
See application file for complete search history.

(56) References Cited

U.S. PATENT DOCUMENTS 7,452,738 B2 * 11/2008 Hayashi .............. H01L 51/5237
438/29

(Continued)

FOREIGN PATENT DOCUMENTS

| CN | 1392615 A | 1/2003 |
|---|---|---|
| CN | 101241915 A | 8/2008 |

(Continued)

OTHER PUBLICATIONS

Jong et al., "Engineering Mechanics: Statistics" (Dec. 1991) p. 6.*
(Continued)

*Primary Examiner* — Nikolay Yushin
(74) *Attorney, Agent, or Firm* — Nath, Goldberg & Meyer; Joshua B. Goldberg; Christopher Thomas

(57) ABSTRACT

The invention provides a display substrate, a manufacturing method thereof and a flexible display device. The display substrate in the present invention includes a base substrate and a vulnerable member arranged on the base substrate, as well as a stress absorption layer arranged between the base substrate and the vulnerable member, wherein the projection of the vulnerable member on the base substrate is within the projection region of the stress absorption layer on the base substrate; the stress absorption layer is not arranged on part of the base substrate. Since the display substrate and the flexible display device provided by the present invention are provided with the stress absorption layer, stress generated during bending may be dispersed through the stress absorption layer to protect the vulnerable member from being damaged, so as to improve the reliability of the display substrate and the flexible display device.

19 Claims, 2 Drawing Sheets

(51) Int. Cl.
*H01L 51/00* (2006.01)
*H01L 29/786* (2006.01)
*H01L 27/12* (2006.01)
*H01L 27/32* (2006.01)

(52) U.S. Cl.
CPC ....... *H01L51/0001* (2013.01); *H01L 27/3244* (2013.01); *H01L 2251/10* (2013.01); *H01L 2251/5338* (2013.01); *Y02E 10/549* (2013.01)

(56) References Cited

U.S. PATENT DOCUMENTS

| | | | | |
|---|---|---|---|---|
| 7,943,932 B2* | 5/2011 | Park | ................. | H01L 29/78603 257/252 |
| 7,994,617 B2* | 8/2011 | Arai | .................... | G06K 19/025 257/679 |
| 8,294,869 B2* | 10/2012 | Yamaguchi | ....... | G02F 1/133305 349/158 |
| 2007/0159335 A1* | 7/2007 | Arai | .................... | G06K 19/025 340/572.8 |
| 2010/0002404 A1* | 1/2010 | Fujita | .................. | H05K 1/0271 361/752 |

FOREIGN PATENT DOCUMENTS

| | | |
|---|---|---|
| CN | 203013725 U | 6/2013 |
| CN | 103489880 A | 1/2014 |
| CN | 203521412 U | 4/2014 |

OTHER PUBLICATIONS

Search Report issued in International Application No. PCT/CN2014/078013, sixteen (16) pages.
Chinese Office Action dated Jun. 17, 2014 issued in corresponding Chinese Application No. 201310475753.3.

* cited by examiner with the increase of the number of bending operations, various vulnerable members on the flexible base substrate of the flexible display device are liable to be damaged. For example, due to the stress aggregation during bending, the film layers of the thin film transistor (TFT) as a vulnerable member are likely to be fractured, which will affect the performance of the TFT and thus affect the reliability of the flexible display device. Therefore, how to avoid the damage to the vulnerable members due to stress is very important for the reliability of the flexible display device.

DISPLAY SUBSTRATE, MANUFACTURING METHOD THEREOF AND FLEXIBLE DISPLAY DEVICE

This is a National Phase Application filed under 35 U.S.C. 371 as a national stage of PCT/CN2014/078013, filed May 21, 2014, and claims priority benefit from Chinese Application No. 201310475753.3, filed Oct. 12, 2013, the content of each of which is hereby incorporated by reference in its entirety.

FIELD OF THE INVENTION

The present invention belongs to the field of display technology, and particularly relates to a display substrate, a manufacturing method thereof and a flexible display device containing the display substrate.

BACKGROUND OF THE INVENTION

Flexible display technology is a forward-looking technology which is popular in recent years, and a flexible display device is light and thin, bendable and even curlable and good in mechanical properties, thus attracting more and more attention of people. The flexible display device includes a display substrate, wherein the display substrate includes a base substrate and a structure on the base substrate, the base substrate is a flexible base substrate, for example, a polyimide (PI) base substrate, a polyethylene glycol terephthalate (PET) base substrate, a stainless steel base substrate and the like, compared with an ordinary glass base substrate, the flexible base substrate has the characteristic of bendability, and this proposes higher requirements on the reliability of devices and especially vulnerable members.

Stress aggregation will be generated during bending, and with the increase of the number of bending operations, various vulnerable members on the flexible base substrate of the flexible display device are liable to be damaged. For example, due to the stress aggregation during bending, the film layers of the thin film transistor (TFT) as a vulnerable member are likely to be fractured, which will affect the performance of the TFT and thus affect the reliability of the flexible display device. Therefore, how to avoid the damage to the vulnerable members due to stress is very important for the reliability of the flexible display device.

SUMMARY OF THE INVENTION

The object of the present invention is to provide a display substrate capable of reinforcing the reliability of a vulnerable member, for solving the problem of poor reliability of the vulnerable member on the display substrate in the prior art.

The technical solution used for solving the technical problem in the present invention is a display substrate, including: a base substrate and a vulnerable member arranged on the base substrate, wherein the display substrate further includes a stress absorption layer arranged between the base substrate and the vulnerable member; and the projection of the vulnerable member on the base substrate is within the projection region of the stress absorption layer on the base substrate.

Preferably, the projection of the vulnerable member on the base substrate coincides with the projection of the stress absorption layer on the base substrate.

Preferably, the thickness of the stress absorption layer is in the range of 200 nm-400 nm, and/or the material of the stress absorption layer is silicon nitride or silicon oxide.

Preferably, a buffer layer is further arranged between the base substrate and the vulnerable member.

For example, the stress absorption layer is arranged between the buffer layer and the base substrate, and the vulnerable member is arranged on the buffer layer.

For example, the buffer layer is arranged between the stress absorption layer and the base substrate, and the vulnerable member is arranged on the stress absorption layer.

Preferably, the material of the buffer layer is silicon nitride or silicon oxide.

Preferably, the vulnerable member includes one or more of a thin film transistor, a gate line and a data line.

Preferably, the substrate includes one of a polyimide base substrate, a polyethylene glycol terephthalate base substrate and a stainless steel base substrate.

The present invention further provides a method for manufacturing a display substrate, including the following steps: preparing a base substrate; arranging a stress absorption layer above the substrate; and arranging a vulnerable member above the stress absorption layer, wherein the projection of the vulnerable member on the base substrate is within the projection region of the stress absorption layer on the base substrate.

Preferably, a buffer layer is arranged on the base substrate before a stress buffer layer is arranged above the base substrate; optionally, the buffer layer is arranged on the stress absorption layer before the vulnerable member is arranged above the stress buffer layer.

Preferably, the step of arranging the stress absorption layer above the base substrate includes: depositing a material layer of the stress absorption layer by adopting a plasma enhanced chemical vapor deposition method, and performing a patterning process on the material layer by adopting a mask plate corresponding to the shape of the vulnerable member to form the pattern of the stress absorption layer.

Another object of the present invention is to provide a flexible display device, for solving the problem of poor reliability of a vulnerable member of the flexible display device in the prior art, and the flexible display device includes the above-mentioned display substrate.

Preferably, the display substrate included in the flexible display device is a flexible organic light emitting diode display substrate.

According to the display substrate and the flexible display device provided by the present invention, since the stress absorption layer is only arranged below the vulnerable member, and no stress absorption layer is arranged on other positions, stress generated during bending may be dispersed through the stress absorption layer to avoid stress concentration at the vulnerable member (namely, at the stress absorption layer), in order to protect the vulnerable member (e.g., TFT) from being damaged to improve the reliability of the display substrate and the flexible display device.

1—PI base substrate; 2—buffer layer; 3—stress absorption layer; 4—gate insulation layer; 5—etching blocking layer; 6—planarization layer; 7—indium tin oxide layer; 8—gate; 9—active layer; 10—source and drain; 11—PET base substrate.

DETAILED DESCRIPTION OF THE EMBODIMENTS

In order that those skilled in the art may better understand the technical solutions of the present invention, a further detailed description of the present invention will be given below in combination with accompanying drawings and specific implementations.

The present invention provides a display substrate, including: a base substrate and a vulnerable member arranged on the base substrate, as well as a stress absorption layer arranged between the base substrate and the vulnerable member; the projection of the vulnerable member on the base substrate is within the projection region of the stress absorption layer on the base substrate; the stress absorption layer is not arranged on part of the base substrate.

Wherein, the base substrate may be one of a polyimide (PI) base substrate, a polyethylene glycol terephthalate (PET) base substrate and a stainless steel base substrate; the vulnerable member is one or more of a thin film transistor, a gate line and a data line.

Preferably, the projection of the vulnerable member on the base substrate coincides with the projection of the stress absorption layer on the base substrate.

Preferably, the thickness of the stress absorption layer is in the range of 200 nm-400 nm, and/or the material of the stress absorption layer is silicon nitride or silicon oxide.

Preferably, a buffer layer is further arranged between the base substrate and the vulnerable member.

For example, the stress absorption layer is arranged between the buffer layer and the base substrate, and the vulnerable member is arranged on the buffer layer.

For example, the buffer layer is arranged between the stress absorption layer and the base substrate, and the vulnerable member is arranged on the stress absorption layer.

Preferably, the material of the buffer layer is silicon nitride or silicon oxide.

The present invention further provides a flexible display device including the above-mentioned display substrate.

Preferably, the display substrate is a flexible organic light emitting diode display substrate.

Embodiment 1

Figure 1:
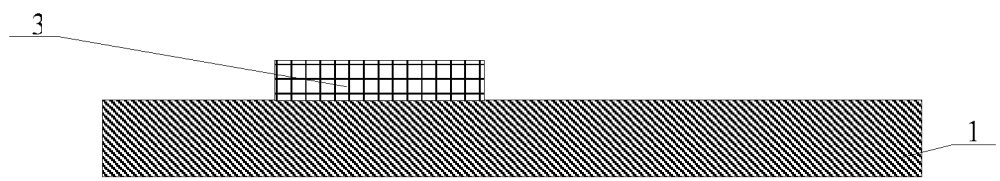
FIG. 1 is a schematic diagram of a structure after a stress absorption layer is prepared on a base substrate in embodiment 1.
Figure 2:
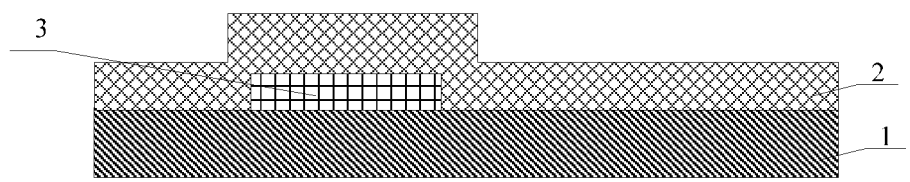
FIG. 2 is a schematic diagram of a structure after a buffer layer is prepared on the base substrate in embodiment 1.
Figure 3:
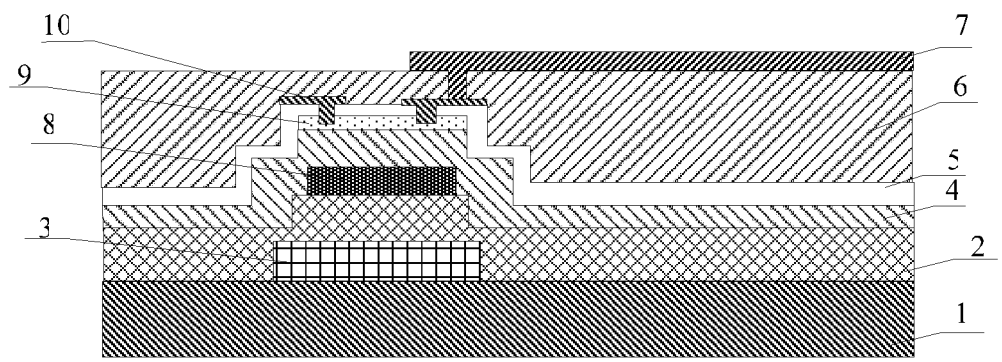
FIG. 3 is a schematic diagram of a structure after a TFT is prepared on the base substrate in embodiment 1.

As shown in FIG. 1 to FIG. 3, this embodiment provides a display substrate, including a polyimide (PI) base substrate 1 and a TFT (used as an example of a vulnerable member) arranged on the PI base substrate, wherein a stress absorption layer 3 is arranged between the PI base substrate 1 and the TFT; the stress absorption layer 3 is formed by a patterning process, for example, the stress absorption layer 3 is formed by performing a patterning process by adopting a mask plate corresponding to the shape of the TFT.

As shown in FIG. 3, the projection of the TFT on the PI base substrate 1 is within the projection region of the stress absorption layer 3 on the PI base substrate 1. Preferably, the projection of the TFT on the base substrate coincides with the projection of the stress absorption layer 3 on the base substrate, namely, the stress absorption layer 3 is only arranged below the TFT. Therefore, stress generated when the display substrate is bent may be dispersed through the stress absorption layer 3 to avoid stress concentration at the TFT (namely, at the stress absorption layer 3), in order to protect the TFT from being damaged to improve the reliability of the display substrate and the flexible display device including the display substrate.

Preferably, the thickness of the stress absorption layer 3 is in the range of 200 nm-400 nm. The inventor has found that, the thickness of the stress absorption layer 3 within the range is proper, if being too thin, the stress absorption layer could not absorb the stress; if being too thick, the stress absorption layer will affect the configuration of other functional layers and waste materials.

Preferably, the material of the stress absorption layer 3 is silicon nitride or silicon oxide. The inventor has found that, the stress absorption effect of the stress absorption layer 3 made of the silicon nitride or silicon oxide is more excellent.

Preferably, as shown in FIG. 2, a buffer layer 2 is arranged above the stress absorption layer 3, and the buffer layer 2 may also absorb a part of the stress generated when the display substrate is bent; as shown in FIG. 3, the TFT is arranged on the buffer layer 2.

Preferably, the buffer layer 2 is made of silicon nitride or silicon oxide, and for example, may be prepared by adopting a plasma enhanced chemical vapor deposition method.

It may be understood that, the vulnerable member in this embodiment may also be one or two of a gate line and a data line, moreover, the vulnerable member may be any other device included in the flexible display device and liable to be damaged during the display substrate is bent.

The above-mentioned display substrate is prepared according to the following steps:

Step 1, the stress absorption layer is prepared.

The material layer of the stress absorption layer 3 is deposited on the PI base substrate 1, for example, a silicon nitride layer is deposited by adopting the plasma enhanced chemical vapor deposition method, wherein the deposition conditions are as follows: the temperature is 350° C., $NH_3/SiH_4$ is 8:1, the total gas flow is 4320 sccm, the pressure is 170 Pa, the deposition time is 2100 s, and the material layer of the stress absorption layer 3 with a thickness of 200 nm is formed. The material layer of the stress absorption layer 3 with other thicknesses may be formed by adjusting parameters such as the deposition time and the like, and the thickness is preferably in the range of 200 nm-400 nm.

A patterning process is performed on the deposited material layer of the stress absorption layer 3 by adopting a mask plate corresponding to the shape of the vulnerable member to form the pattern of the stress absorption layer 3, in this embodiment, the vulnerable member is a TFT, the vulnerable member may also be other device to be protected, for example, the data line, the gate line and the like. The specific patterning process is the prior art and will not be repeated redundantly herein.

Step 2, the buffer layer is prepared.

Silicon nitride is deposited on the PI base substrate 1 subjected to step 1 by adopting the plasma enhanced chemical vapor deposition method to form the buffer layer 2, wherein the deposition conditions are as follows: the temperature is 350° C., $NH_3/SiH_4$ is 8:1, the total gas flow is 4320 sccm, the pressure is 170 Pa, the deposition time is 1800 s, and the buffer layer 2 with a thickness of 150 nm is formed.

The buffer layer 2 covers the entire polyimide PI base substrate 1 to form the structure as shown in FIG. 2.

The above-mentioned buffer layer 2 achieves the following functions: flattening the surface of the PI base substrate 1; ensuring better bonding between the base substrate 1 and devices to be formed on the base substrate 1; blocking water and oxygen to ensure the performance of the display substrate.

Step 3, other necessary functional layers are prepared.

The other necessary functional layers are prepared on the PI base substrate 1 subjected to step 2, for example, a gate insulation layer 4, an etching blocking layer 5, a planarization layer 6, an indium tin oxide layer 7, a gate 8, an active layer 9, and a source and a drain 10, as shown in FIG. 3. The manufacturing of the above-mentioned functional layers is the prior art and will not be repeated redundantly herein. The TFT and the other necessary devices are formed to finish the manufacturing of the flexible display substrate so as to form the display substrate as shown in FIG. 3, wherein the stress absorption layer 3 (formed by the patterning process) is only reserved below the TFT (used as the example of the vulnerable member), namely, the projection of the TFT (used as the example of the vulnerable member) on the PI base substrate 1 is fallen into the projection region of the stress absorption layer 3 on the PI base substrate 1. Of course, the projection of the TFT (used as the example of the vulnerable member) on the PI base substrate 1 may also coincide with the projection of the stress absorption layer 3 on the PI base substrate 1, and this mainly depends on the shape of the mask plate. Those skilled in the art should understand that a desired shape of the stress absorption layer 3 may be formed by controlling the shape of the mask plate.

In the display substrate with the stress absorption layer 3 prepared in this embodiment, the stress generated when the display substrate is bent may be dispersed through the stress absorption layer 3 to protect the vulnerable member (e.g., TFT) from being damaged, so as to improve the reliability of the display substrate.

Embodiment 2

Figure 4:
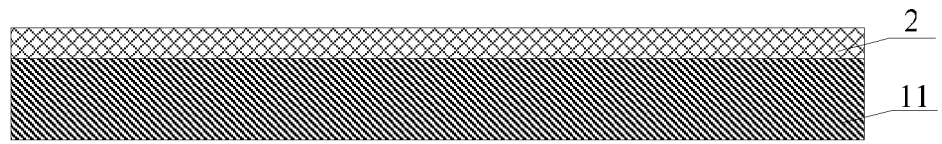
FIG. 4 is a schematic diagram of a structure after a stress absorption layer is prepared on a base substrate in embodiment 2.
Figure 5:
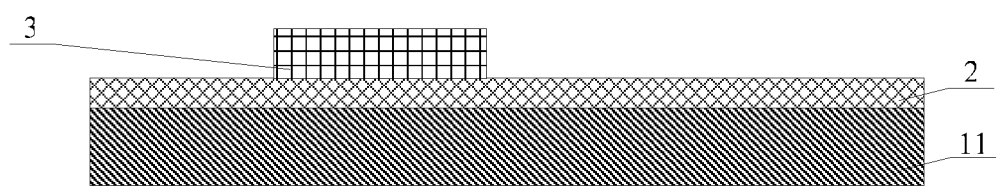
FIG. 5 is a schematic diagram of a structure after a buffer layer is prepared on the base substrate in embodiment 2.
Figure 6:
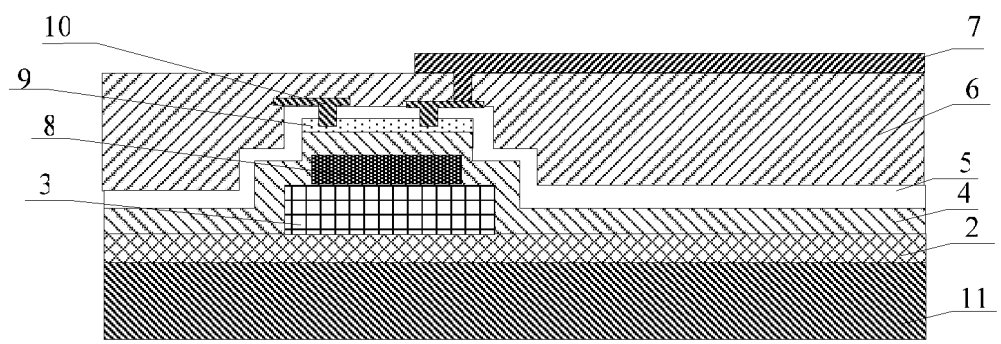
FIG. 6 is a schematic diagram of a structure after a TFT is prepared on the base substrate in embodiment 2.

As shown in FIG. 4 to FIG. 6, this embodiment provides a display substrate, including a polyethylene glycol terephthalate (PET) base substrate 11 and a TFT (used as an example of a vulnerable member) arranged on the PET base substrate 11, wherein a stress absorption layer 3 is arranged between the PET base substrate 11 and the TFT; the stress absorption layer 3 is formed by a patterning process, for example, the stress absorption layer 3 is formed by performing a patterning process by adopting a mask plate corresponding to the shape of the TFT (used as the example of the vulnerable member).

As shown in FIG. 6, the projection of the TFT on the PET base substrate 11 is within the projection region of the stress absorption layer 3 on the PET base substrate 11. Preferably, the projection of the TFT on the base substrate coincides with the projection of the stress absorption layer 3 on the base substrate. The stress absorption layer 3 is not arranged on part of the PI base substrate 11, namely, the stress absorption layer 3 is only arranged below the TFT. Therefore, stress generated when the display substrate is bent may be dispersed through the stress absorption layer 3 to avoid stress concentration at the TFT (namely, at the stress absorption layers 3), in order to protect the TFT from being damaged to improve the reliability of the display substrate and the flexible display device including the display substrate.

Preferably, the thickness of the stress absorption layer 3 is 200 nm-400 nm. The inventor has found that, the stress absorption layer 3 within the thickness range is proper, if being too thin, the stress absorption layer could not absorb the stress; if being too thick, the stress absorption layer will affect the manufacturing of other functional layers and waste materials.

Preferably, the material of the stress absorption layer 3 is silicon nitride or silicon oxide. The inventor has found that, the stress absorption effect of the stress absorption layer 3 made of the silicon nitride or silicon oxide is more excellent.

Preferably, as shown in FIG. 5, a buffer layer 2 is arranged below the stress absorption layer 3, and the buffer layer 2 may absorb a part of the stress generated when the display substrate is bent; as shown in FIG. 6, the TFT is arranged on the stress absorption layer 3.

Preferably, the buffer layer 2 is made of silicon nitride or silicon oxide, for example, the buffer layer 2 may be prepared by adopting a plasma enhanced chemical vapor deposition method.

It may be understood that, the vulnerable member in this embodiment may be one or more of a gate line and a data line, and moreover, the vulnerable member may be any other device included in the flexible display device and liable to be damaged during the display substrate is bent.

The above-mentioned display substrate is prepared according to the following steps:

Step 1, the buffer layer is prepared.

Silicon oxide is deposited on the PET base substrate 11 by adopting the plasma enhanced chemical vapor deposition method to form the buffer layer 2. The deposition conditions are as follows: the temperature is 350° C., $NH_3/SiH_4$ is 8:1, the total gas flow is 4320 sccm, the pressure is 170 Pa, the deposition time is 2000 s, and the buffer layer 2 with a thickness of 200 nm is formed.

The buffer layer 2 covers the entire PET base substrate 11 to form the structure as shown in FIG. 4.

The above-mentioned buffer layer 2 achieves the following functions: flattening the surface of the PET base substrate 11; ensuring better bonding between the PET base substrate 11 and devices to be formed on the PET base substrate 11; blocking water and oxygen to ensure the performance of the devices.

Step 2, the stress absorption layer is prepared.

The material layer of the stress absorption layer 3 is deposited on the PET base substrate 11 subjected to step 1, for example, a silicon oxide layer is deposited by adopting the plasma enhanced chemical vapor deposition method, wherein the deposition conditions are as follows: the temperature is 350° C., $NH_3/SiH_4$ is 8:1, the total gas flow is 4320 sccm, the pressure is 170 Pa, the deposition time is 4200 s, and the material layer of the stress absorption layer 3 with a thickness of 400 nm is formed. The material layer of the stress absorption layer 3 with other thicknesses may be formed by adjusting parameters such as the deposition time and the like, and the thickness is preferably 200 nm-400 nm.

A patterning process is performed on the deposited material layer of the stress absorption layer 3 by adopting a mask plate corresponding to the shape of the TFT to form the pattern of the stress absorption layer 3, in this embodiment, the vulnerable member is the TFT, the vulnerable member may also be other devices to be protected, for example, the data line, the gate line and the like. The specific patterning process belongs to the prior art and will not be repeated redundantly herein.

Step 3, other necessary functional layers are prepared.

The other necessary functional layers are prepared on the PET base substrate 11 subjected to step 2, for example, a gate insulation layer 4, an etching blocking layer 5, a planarization layer 6, an indium tin oxide layer 7, a gate 8, an active layer 9, and a source and a drain 10, as shown in FIG. 6. The manufacturing of the above-mentioned functional layers is the prior art and will not be repeated redundantly herein. The TFT and the other necessary devices are formed to finish the manufacturing of the flexible display substrate so as to form the display substrate as shown in FIG. 6, wherein the stress absorption layer 3 (formed by the patterning process) is only reserved below the TFT (used as the example of the vulnerable member), namely, the projection of the TFT (used as the example of the vulnerable member) on the PET base substrate 11 is fallen into the projection region of the stress absorption layer 3 on the PET base substrate 11. Of course, the projection of the TFT (used as the example of the vulnerable member) on the PET base substrate 11 may also coincide with the projection of the stress absorption layer 3 on the PET base substrate 11, and this mainly depends on the shape of the mask plate. Those skilled in the art should understand that a desired shape of the stress absorption layer 3 may be formed by controlling the shape of the mask plate.

In the display substrate with the stress absorption layer 3 prepared in this embodiment, the stress generated when the display substrate is bent may be dispersed through the stress absorption layers 3 to protect the vulnerable member (e.g., TFT) from being damaged, so as to improve the reliability of the display substrate.

Embodiment 3

This embodiment provides a flexible display device, including the above-mentioned display substrate and other necessary assemblies. Preferably, the display substrate included in the flexible display device is a flexible organic light emitting diode display substrate.

It may be understood that, the above implementations are merely exemplary implementations adopted for describing the principle of the present invention, rather than limiting the present invention. Various variations and improvements may be made by those of ordinary skill in the art without departing from the spirit and essence of the present invention, and these variations and improvements may be encompassed within the protection scope of the present invention.

The invention claimed is:

1. A display substrate, comprising:
a flexible base substrate and a vulnerable member arranged on the flexible base substrate, wherein
the display substrate further comprises a patterned stress absorption layer arranged between the flexible base substrate and the vulnerable member so that the patterned stress absorption layer is only arranged below the vulnerable member; and
the projection of the vulnerable member on the flexible base substrate is within the projection region of the patterned stress absorption layer on the flexible base substrate;
wherein the patterned stress absorption layer is arranged above the flexible base substrate by depositing a material layer of the stress absorption layer by adopting a plasma enhanced chemical vapor deposition method, and performing a patterning process on the material layer by adopting a mask plate corresponding to the shape of the vulnerable member to form the patterned stress absorption layer.

2. The display substrate of claim 1, wherein the vulnerable member comprises one or more of a thin film transistor, a gate line and a data line.

3. The display substrate of claim 1, wherein the flexible base substrate comprises one of a polyimide base substrate, a polyethylene glycol terephthalate base substrate and a stainless steel base substrate.

4. The display substrate of claim 1, wherein the thickness of the patterned stress absorption layer is in the range of 200 nm-400 nm, and/or the material of the patterned stress absorption layer is silicon nitride or silicon oxide.

5. The display substrate of claim 4, wherein a buffer layer is further arranged between the flexible base substrate and the vulnerable member.

6. A flexible display device, comprising the display substrate of claim 1.

7. The flexible display device of claim 6, wherein the display substrate is a flexible organic light emitting diode display substrate.

8. The display substrate of claim 1, wherein the projection of the vulnerable member on the flexible base substrate coincides with the projection of the patterned stress absorption layer on the flexible base substrate.

9. The display substrate of claim 8, wherein a buffer layer is further arranged between the flexible base substrate and the vulnerable member.

10. The display substrate of claim 8, wherein the thickness of the patterned stress absorption layer is in the range of 200 nm-400 nm, and/or the material of the patterned stress absorption layer is silicon nitride or silicon oxide.

11. The display substrate of claim 10, wherein a buffer layer is further arranged between the flexible base substrate and the vulnerable member.

12. The display substrate of claim 1, wherein a buffer layer is further arranged between the flexible base substrate and the vulnerable member.

13. The display substrate of claim 12, wherein the patterned stress absorption layer is arranged between the buffer layer and the flexible base substrate, and the vulnerable member is arranged on the buffer layer.

14. The display substrate of claim 12, wherein the buffer layer is arranged between the patterned stress absorption layer and the flexible base substrate, and the vulnerable member is arranged on the patterned stress absorption layer.

15. The display substrate of claim 12, wherein the material of the buffer layer is silicon nitride or silicon oxide.

16. A method for manufacturing a display substrate, comprising the following steps:
preparing a base substrate;
arranging a stress absorption layer above the base substrate; and
arranging a vulnerable member above the stress absorption layer,
wherein the projection of the vulnerable member on the base substrate is within the projection region of the stress absorption layer on the base substrate;
wherein the step of arranging the stress absorption layer above the base substrate comprises: depositing a material layer of the stress absorption layer by adopting a plasma enhanced chemical vapor deposition method, and performing a patterning process on the material layer by adopting a mask plate corresponding to the shape of the vulnerable member to form the pattern of the stress absorption layer.

17. The method of claim 16, wherein the thickness of the stress absorption layer is in the range of 200 nm-400 nm, and/or the material of the stress absorption layer is silicon nitride or silicon oxide.

18. The method of claim 16, further comprising a step of arranging a buffer layer on the base substrate before the step of arranging a stress absorption layer above the base substrate.

19. The method of claim 16, further comprising a step of arranging a buffer layer on the stress absorption layer before the step of arranging the vulnerable member above the stress absorption layer.

\* \* \* \* \*